United States Patent
Sugiyama

(10) Patent No.: US 8,239,081 B2
(45) Date of Patent: Aug. 7, 2012

(54) HYBRID TYPE WORKING MACHINE

(75) Inventor: Yuta Sugiyama, Yokosuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 354 days.

(21) Appl. No.: 12/718,505

(22) Filed: Mar. 5, 2010

(65) Prior Publication Data

US 2010/0228416 A1  Sep. 9, 2010

(30) Foreign Application Priority Data

Mar. 5, 2009  (JP) ................................. 2009-052197
Nov. 17, 2009 (JP) ................................. 2009-262062

(51) Int. Cl.
*H02J 7/00* (2006.01)

(52) U.S. Cl. ........................................ 701/22; 320/166

(58) Field of Classification Search .................... 701/22, 701/490; 320/166–167; 323/271; 365/226–229; 327/540

See application file for complete search history.

(56) References Cited

U.S. PATENT DOCUMENTS

| 7,023,185 | B2 * | 4/2006 | Olson | 323/222 |
| 2001/0029220 | A1 * | 10/2001 | Kato | 477/5 |
| 2003/0102673 | A1 * | 6/2003 | Nada | 290/40 C |
| 2007/0194759 | A1 * | 8/2007 | Shimizu et al. | 320/166 |
| 2007/0268769 | A1 * | 11/2007 | Okuyama et al. | 365/227 |
| 2008/0231351 | A1 * | 9/2008 | Ogiwara et al. | 327/541 |

FOREIGN PATENT DOCUMENTS

JP   2007-155586   6/2007

* cited by examiner

*Primary Examiner* — Mary Cheung
(74) *Attorney, Agent, or Firm* — Squire Sanders (US) LLP

(57) ABSTRACT

A charge accumulating circuit accumulates regeneration power. The charge accumulating circuit includes a DC bus line which is connected to a smoothing capacitor, a charge accumulating capacitor with an internal resistance, and a converter which connects the DC bus line and the charge accumulating capacitor to each other, and performs a charge/discharge operation. The control device changes the OFF state of the first switch to the ON state when the start key is turned on, measures a physical quantity involved with a discharge characteristic of the charge accumulating capacitor, and calculates at least one of the internal resistance and a capacitance of the charge accumulating capacitor on the basis of a measurement result.

12 Claims, 10 Drawing Sheets

HYBRID TYPE WORKING MACHINE

BACKGROUND OF THE INVENTION

1. Field of the Invention

The present invention relates to a hybrid type working machine which converts kinetic energy or potential energy into electric energy, accumulates electricity in a charge accumulating device, and drives a driving system by using accumulated electric energy.

Priority is claimed on Japanese Patent Application No. 2009-052197 filed Mar. 5, 2009 and Japanese Patent Application No. 2009-262062 filed Nov. 17, 2009, the content of which is incorporated herein by reference.

2. Description of the Related Art

In recent years, out of consideration for the environment, improvements in performance, such as fuel savings, lower pollution, and lower noise, have been demanded in power generating machines, such as construction working machines. In order to meet the demand, working machines such as hydraulic shovels using an electric motor instead of or to assist a hydraulic pump have been introduced. In a working machine attached with the electric motor, excessive kinetic energy generated from the electric motor is converted into electric energy, and accumulated in a capacitor or the like. As the capacitor, for example, an electric double-layer condenser (capacitor) is used.

The capacitor deteriorates over long-term usage due to repeating charge/discharge operations, overcharging, over-discharging, or heating. The deterioration state may be determined by measuring the internal resistance of the capacitor (refer to JP-A-2007-155586).

SUMMARY OF THE INVENTION

An object of the invention is to provide a technology of measuring a characteristic of a capacitor in a hybrid type working machine using the capacitor.

According to an aspect of the invention, there is provided a hybrid type working machine including: a first electric motor which performs a power running operation driven by a supply of electric power and a regenerating operation generating electric power; a first electric circuit which controls the power running operation and the regenerating operation of the first electric motor; a charge accumulating circuit which supplies electric power to the first electric motor and accumulates electric power regenerated by the first electric motor; a control device which controls the first electric circuit and the charge accumulating circuit; and a start key which activates the control device, wherein the charge accumulating circuit includes: a DC bus line which is connected to the first electric circuit and in which a smoothing capacitor is connected between a ground line and a power line; a charge accumulating capacitor with an internal resistance; a converter which connects the DC bus line and the charge accumulating capacitor to each other, and performs a discharge operation of supplying electric energy from the charge accumulating capacitor to the DC bus line and a charge operation of supplying electric energy from the DC bus line to the charge accumulating capacitor; and a first switch which performs switching between an ON state and an OFF state, the ON state allowing current to flow between the charge accumulating capacitor and the DC bus line, and the OFF state not allowing current to flow between the charge accumulating capacitor and the DC bus line, and wherein the control device switches the first switch from the OFF state to the ON state due to the start key being turned on, measures a physical quantity involved with a discharge characteristic of the charge accumulating capacitor, and calculates at least one of the internal resistance and a capacitance of the charge accumulating capacitor on the basis of a measurement result.

Upon starting the hybrid type working machine, it is possible to measure the internal resistance of the charge accumulating capacitor. Accordingly, it is possible to determine the deterioration state of the charge accumulating capacitor.

DETAILED DESCRIPTION OF THE INVENTION

Hereinafter, first and second examples will be described with reference to the drawings.

FIRST EXAMPLE

Figure 1:
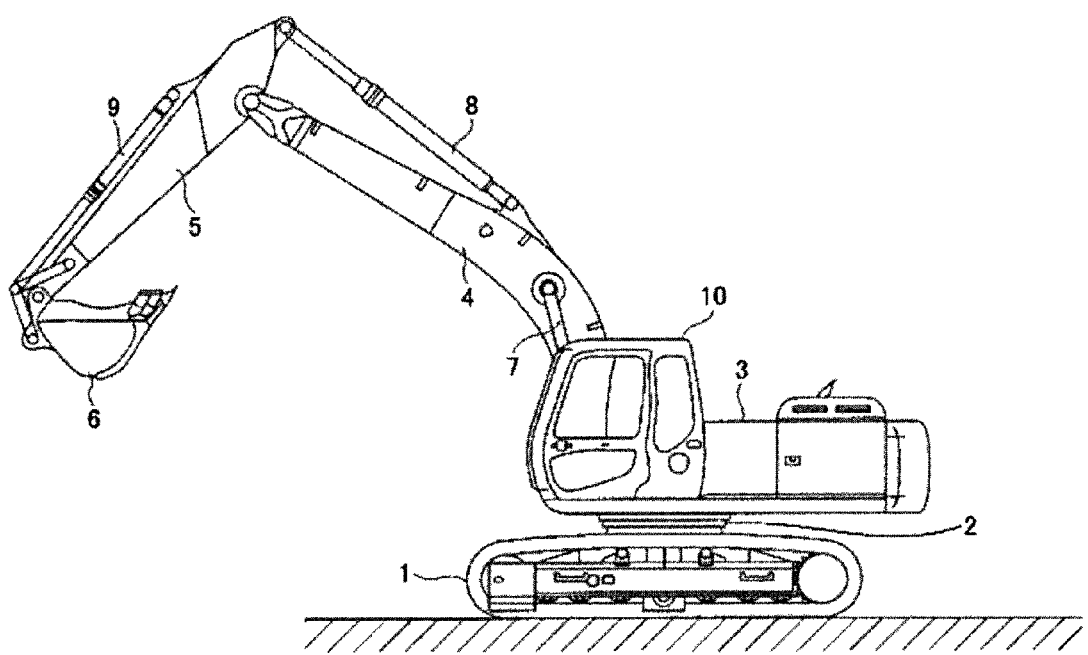
FIG. 1 is a side view of a hybrid type working machine according to a first example.

FIG. 1 is a side view showing a hybrid type working machine according to a first example. A lower traveling body (base) 1 is mounted with an upper turning body 3 with a turning mechanism 2 therebetween. The turning mechanism 2 includes an electric motor, and rotates the upper turning body 3 in the clockwise direction or the counter-clockwise direction. The upper turning body 3 is mounted with a boom 4. The boom 4 is adapted to swing with respect to the upper turning body 3 by a boom cylinder 7 which is driven by a hydraulic pressure. The front end of the boom 4 is attached with an arm 5. The arm 5 is adapted to swing in the front-back direction with respect to the boom 4 by an arm cylinder 8 which is driven by a hydraulic pressure. The front end of the arm 5 is attached with a bucket 6. The bucket 6 is adapted to swing with respect to the arm 5 in the vertical direction by a bucket cylinder 9 which is driven by a hydraulic pressure. The upper turning body 3 is mounted with a cabin 10 which accommodates a driver.

Figure 2:
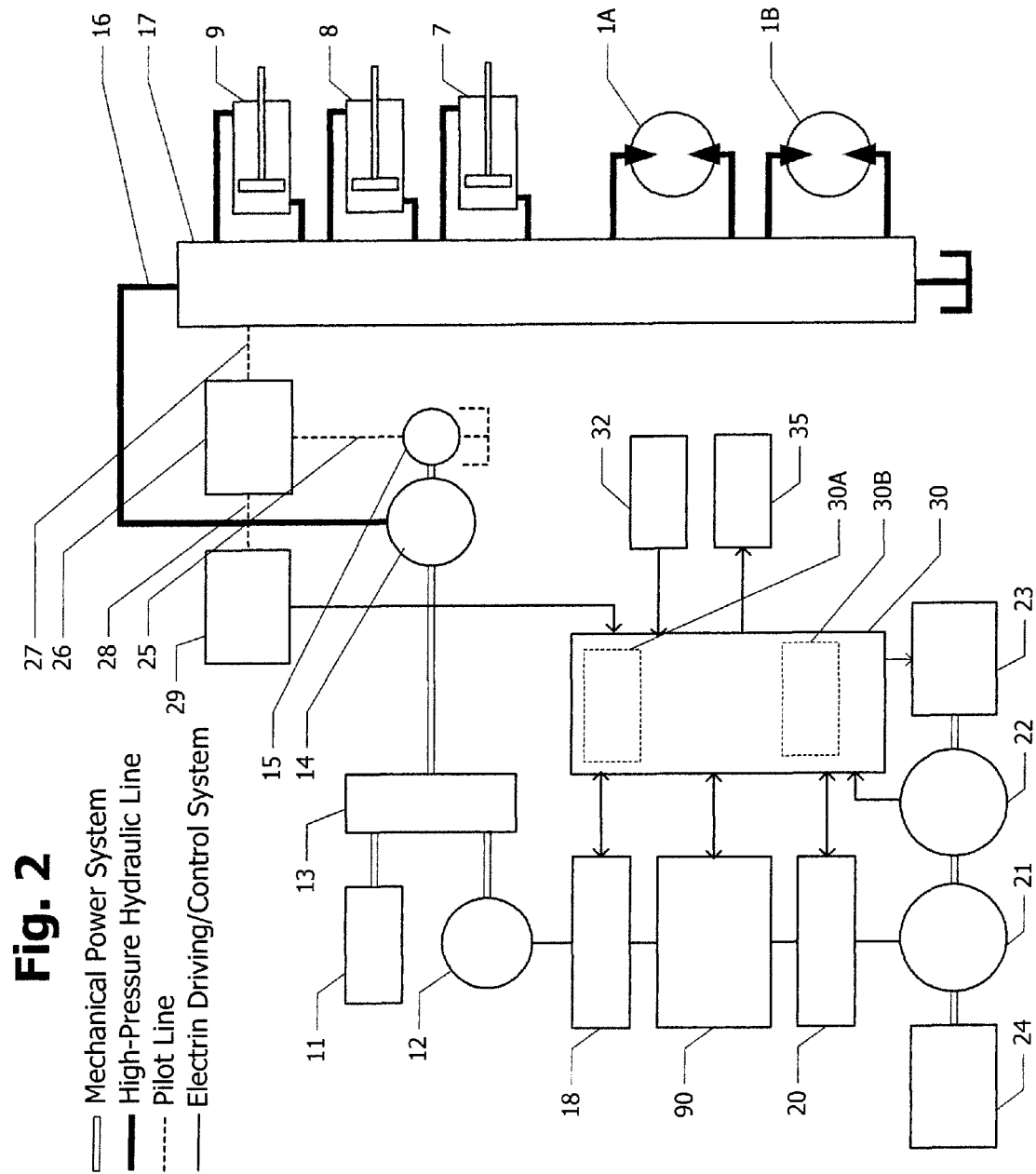
FIG. 2 is a block diagram of the hybrid type working machine according to the first example.

FIG. 2 shows a block diagram of the hybrid type working machine. In FIG. 2, a mechanical power system is depicted by the double line, a high-pressure hydraulic line is depicted by the bold solid line, an electric system is depicted by a thin solid line, and a pilot line is depicted by the dashed line.

A driving shaft of an engine 11 is connected to an input shaft of a transmission 13. As the engine 11, an engine for generating a driving force by using fuel other than electricity, for example, an internal combustion engine such as a diesel engine is used. The engine 11 is normally driven during the operation of the working machine.

A driving shaft of an electric motor generator 12 is connected to another input shaft of the transmission 13. The electric motor generator 12 is capable of performing both operations, that is, an electric (assist) operation and an electricity generating operation. As the motor generator 12, for example, an IPM (interior permanent magnet) motor having a magnet embedded inside a rotor is used.

The transmission 13 includes two input shafts and one output shaft. The output shaft is connected to a driving shaft of a main pump 14.

In the case where a load applied to the engine 11 is large, the electric motor generator 12 performs an assist operation, and the driving force of the electric motor generator 12 is transmitted to the main pump 14 through the transmission 13. Accordingly, a load applied to the engine 11 is reduced. On the other hand, in the case where a load applied to the engine 11 is small, the driving force of the engine 11 is transmitted to the electric motor generator 12 through the transmission 13, so that the electricity generating operation of the electric motor generator 12 is performed. The selection of the assist operation or the electricity generating operation of the electric motor generator 12 is performed by an inverter 18 connected to the electric motor generator 12. The inverter 18 is controlled by a control device 30.

The control device 30 includes a CPU (central processing unit) 30A and an internal memory 30B. The CPU 30A executes a driving control program stored in the internal memory 30B. The control device 30 catches the driver's attention by displaying a deterioration state and the like of various devices on a display device 35.

The main pump 14 supplies a hydraulic pressure to a control valve 17 through the high-pressure hydraulic line 16. The control valve 17 distributes a hydraulic pressure to hydraulic motors 1A and 1B, the boom cylinder 7, the arm cylinder 8, and the bucket cylinder 9 on the basis of the command from the driver. The hydraulic motors 1A and 1B drive left and right crawlers provided in the lower traveling body 1 shown in FIG. 1, respectively.

An input/output terminal of the electric system of the electric motor generator 12 is connected to a charge accumulating circuit 90 through the inverter 18. The inverter 18 performs an operation control of the electric motor generator 12 on the basis of the command from the control device 30. The charge accumulating circuit 90 is connected to a turning electric motor 21 through another inverter 20. The charge accumulating circuit 90 and the inverter 20 are controlled by the control device 30.

During the assist operation of the electric motor generator 12, the demanded electric power is supplied from the charge accumulating circuit 90 to the electric motor generator 12 through the inverter 18. During the electricity generating operation of the electric motor generator 12, the power generated by the electric motor generator 12 is supplied to the charge accumulating circuit 90 through the inverter 18.

The turning electric motor 21 is driven by alternative current on the basis of the PWM (pulse width modulation) control signal from the inverter 20, and is capable of performing both operations, that is, a power running operation and a regenerating operation. As the turning electric motor 21, for example, an IPM motor is used. The IPM motor generates a large induced electromotive force during the regenerating operation.

During the power running operation of the electric turning motor 21, a rotation force of the turning electric motor 21 is transmitted to the turning mechanism 2 shown in FIG. 1 through a transmission 24. At this time, the transmission 24 decreases the rotation speed. Accordingly, the rotation force generated in the turning electric motor 21 is increased and transmitted to the turning mechanism 2. In addition, during the regenerating operation, the rotation movement of the upper rotation body 3 is transmitted to the turning electric motor 21 through the transmission 24, so that a regenerating power is generated from the turning electric motor 21. At this time, the transmission 24 allows the rotation speed to be fast on the contrary to the power running operation. Accordingly, it is possible to increase the rotation frequency of the turning electric motor 21.

The resolver 22 detects the position in the rotation direction of the rotation shaft of the turning electric motor 21. The detection result is input to the control device 30. When the positions in the rotation direction of the rotation shaft before and after the operation of the turning electric motor 21 are detected, it is possible to obtain the turning angle and the turning direction.

A mechanical brake 23 is connected to the rotation shaft of the turning electric motor 21, and generates a mechanical braking force. The brake state or the release state of the mechanical brake 23 is selected by an electromagnetic switch under the control of the control device 30.

A pilot pump 15 generates a pilot pressure required for the hydraulic operation system. The generated pilot pressure is supplied to an operation device 26 through the pilot line 25. The operation device 26 includes a lever or a pedal, and is operated by the driver. The operation device 26 changes a primary hydraulic pressure supplied from the pilot line 25 to a secondary hydraulic pressure in accordance with the driver's operation. The secondary hydraulic pressure is transmitted to the control valve 17 through the hydraulic line 27, and is transmitted to a pressure sensor 29 through another hydraulic line 28.

The detection result of the pressure detected by the pressure sensor 29 is input to the control device 30. Accordingly, the control device 30 is capable of detecting the operation states of the lower traveling body 1, the turning mechanism 2, the boom 4, the arm 5, and the bucket 6. Particularly, in the hybrid type working machine according to the first example, the turning electric motor 21 drives the turning mechanism 2. For this reason, it is preferable to highly precisely detect the operation amount of the lever for controlling the turning mechanism 2. The control device 30 is capable of highly precisely detecting the operation amount of the lever through the pressure sensor 29.

When the operator turns on a start key 32, the control device 30 is activated. The control device 30 starts the control of the engine 11, the inverters 18 and 20, and the charge accumulating circuit 90. The control device 30 is capable of detecting a state (non-operation state) in which any one of the lower traveling body 1, the turning mechanism 2, the boom 4, the arm 5, and the bucket 6 is not operated, and neither the power supply to the charge accumulating circuit 90 nor the compulsory power acquisition from the charge accumulating circuit 90 are performed.

Figure 3:
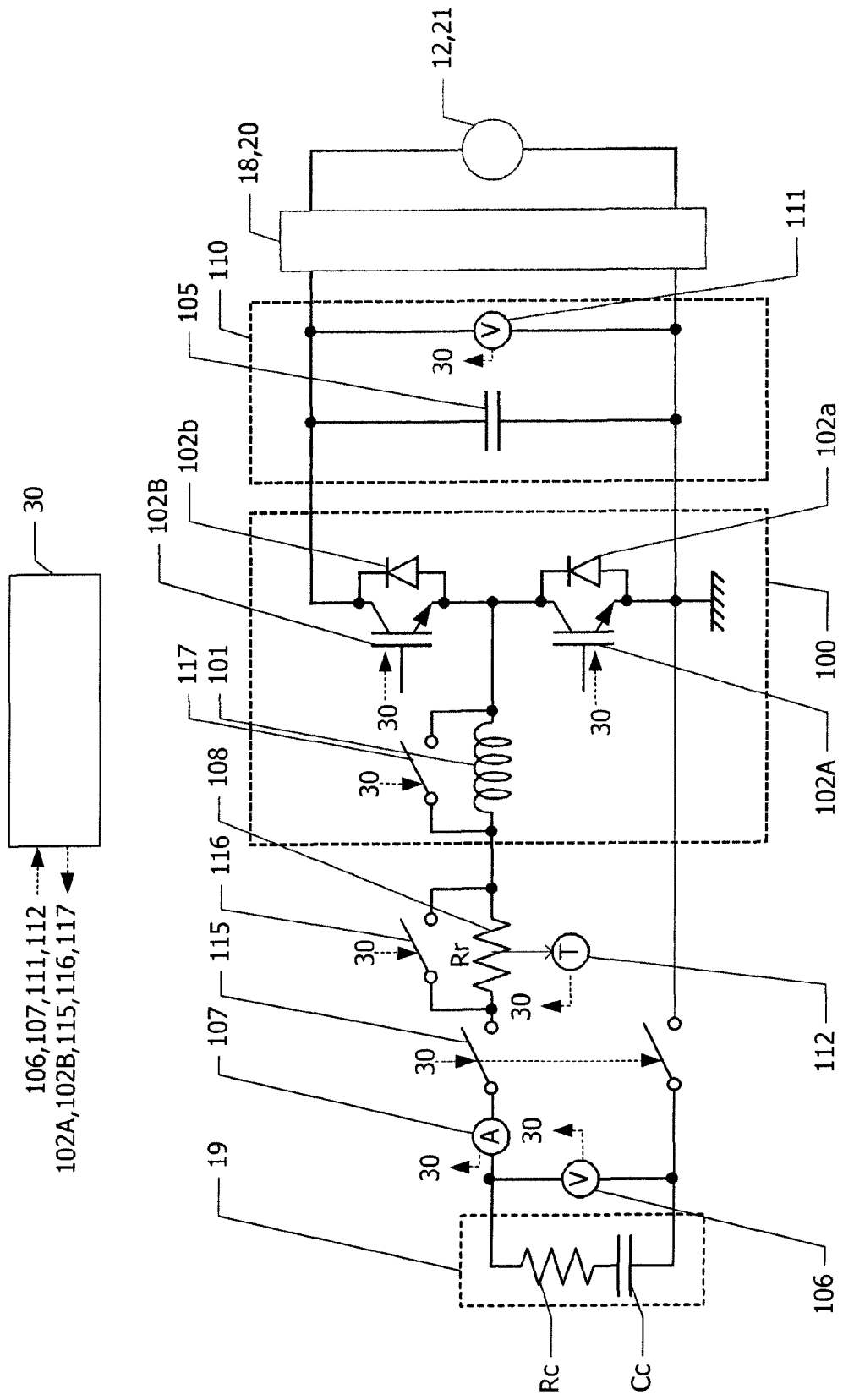
FIG. 3 is an equivalent circuit diagram of a charge accumulating circuit used in the hybrid type working machine according to the first example.

FIG. 3 shows an equivalent circuit diagram of the charge accumulating circuit 90. The charge accumulating circuit 90 includes a charge accumulating capacitor 19, a converter 100, and a DC bus line 110.

The converter 100 connects the charge accumulating capacitor 19 and the DC bus line 110 to each other. In an electric circuit connecting the charge accumulating capacitor 19 and the DC bus line 110, a charging resistor 108 and a first switch 115 are inserted in series to the charge accumulating capacitor 19. The charge accumulating capacitor 19 has, for example, a structure in which a plurality of electric double-layer condensers (capacitors) is connected in series. A capacitance of the charge accumulating capacitor 19 is denoted by Cc, and an internal resistance is denoted by Rc.

The first switch 115 is controlled by the control device 30, and is used to select an ON state in which the charge accumulating capacitor 19 is connected to the DC bus line 110 or an OFF state in which the charge accumulating capacitor 19 is not connected to the DC bus line 110. A second switch 116 is connected to the charging resistor 108 in parallel. The second switch 116 is controlled by the control switch 30, and is capable of realizing a short-circuit state between terminals of the charging resistor 108.

A capacitor voltmeter 106 measures a voltage between terminals of the charge accumulating capacitor 19, and inputs the measurement result to the control device 30. The capacitor ammeter 107 measures a charge/discharge current of the charge accumulating capacitor 19, and inputs the measurement result to the control device 30.

A thermometer 112 measures a temperature of the charging resistor 108, and inputs the measurement result to the control device 30. The resistance value of the charging resistor 108 may change in accordance with the temperature thereof. The control device 30 calculates the resistance value of the charging resistor 108 at the current time point on the basis of the rated resistance value, the temperature characteristic, and the temperature at the current time point of the charging resistor 108.

The DC bus line 110 includes a ground line and a power line. A smoothing capacitor 105 is connected between the ground line and the power line. The ground line and the power line of the DC bus line 110 are respectively connected to the electric motor generator 12 and the turning electric motor 21 through the inverters 18 and 20. The voltage between the ground line and the power line of the DC bus line 110 is measured by a DC bus line voltmeter 111, and the measurement result is input to the control device 30.

The converter 100 includes a boosting IGBT (insulated gate bipolar transistor) 102A, a voltage-dropping IGBT 102B, and a reactor 101. The emitter of the boosting IGBT 102A is connected to the ground line of the DC bus line 110, and the collector of the voltage-dropping IGBT 102B is connected to the power line of the DC bus line 110. The collector of the boosting IGBT 102A is connected to the emitter of the voltage-dropping IGBT 102B. The diodes 102a and 102b are respectively connected to the boosting IGBT 102A and the voltage-dropping IGBT 102B in parallel in such a manner that the direction from the emitter to the collector is a forward direction.

The interconnection point between the boosting IGBT 102A and the voltage-dropping IGBT 102B is connected to one terminal of the charge accumulating capacitor 19 through the reactor 101, and the ground line of the DC bus line 110 is connected to the other terminal of the charge accumulating capacitor 19. A third switch 117 is connected in parallel to the reactor 101. The third switch 117 is controlled by the control device 30 so as to be opened or closed. When the third switch 117 is closed, the terminals of the reactor 101 become in a short-circuit state.

The control device 30 applies a control PWM (pulse width modulation) voltage to the gate electrodes of the boosting IGBT 102A and the voltage-dropping IGBT 102B.

Hereinafter, a boosting operation (discharge operation) will be described. The PWM voltage is applied to the gate electrode of the boosting IGBT 102A. When the boosting IGBT 102A is changed from the ON state to the OFF state, an induced electromotive force is generated in the reactor 101 in a direction in which a current flows to the collector of the boosting IGBT 102A. The induced electromotive force is applied to the DC bus line 110 through the diode 102b. Accordingly, the DC bus line 110 is boosted.

Next, a voltage-dropping operation (charge operation) will be described. The PWM voltage is applied to the gate electrode of the voltage-dropping IGBT 102B. When the voltage-dropping IGBT 102B is changed from the ON state to the OFF state, an induced electromotive force is generated in the reactor 101 in a direction in which a current flows from the emitter of the voltage-dropping IGBT 102B to the charge accumulating capacitor 19. The charge accumulating capacitor 19 is charged by the induced electromotive force. In addition, in the specification, a current in a direction of discharging the charge accumulating capacitor 19 is defined to be positive, and a current in a direction of charging the charge accumulating capacitor 19 is defined to be negative.

By referring to FIGS. 4 and 5, a method will be described which measures the internal resistance Rc and the capacitance Cc of the charge accumulating capacitor 19. This measurement is performed upon starting the hybrid type working machine. Upon starting the working machine, a charge is accumulated in the charge accumulating capacitor 19 shown in FIG. 3, and a charge is not accumulated in the smoothing capacitor 105.

When the hybrid type working machine is started, the control device 30 closes the third switch 117 so as to cause short circuit between the terminals of the reactor 101. The IGBTs 102A and 102B are in an OFF state. In addition, an induced voltage is not generated yet by the electric motor generator 12.

Figure 4:
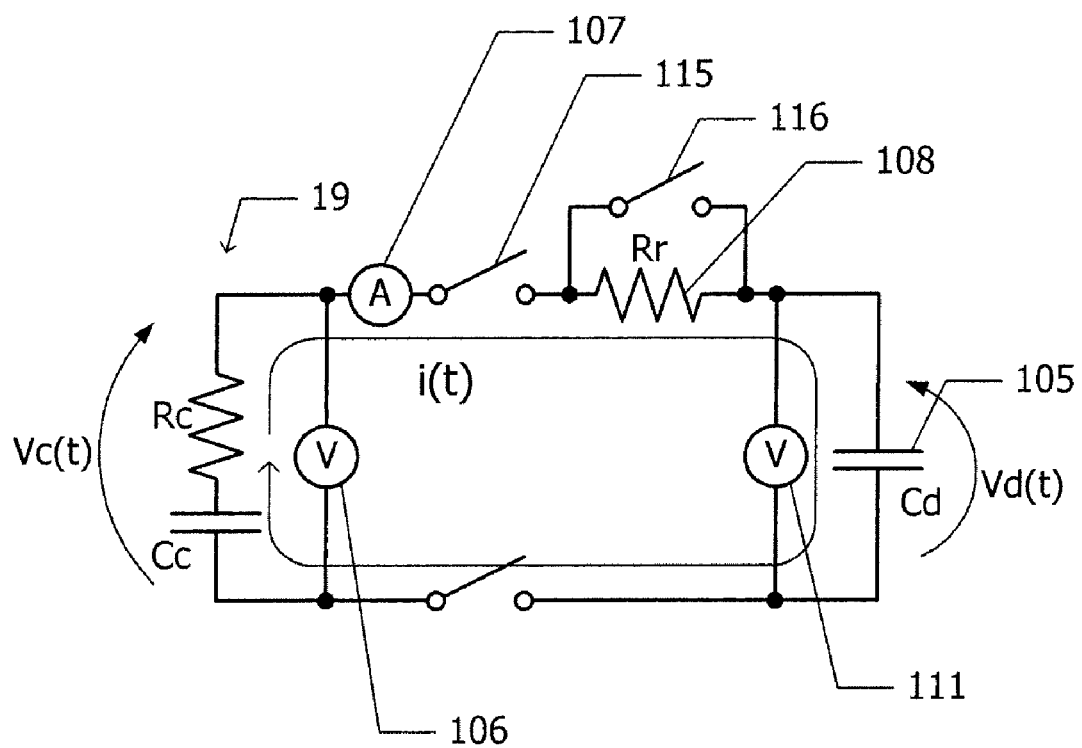
FIG. 4 is an equivalent circuit diagram for illustrating a method of measuring a characteristic of a capacitor of the hybrid type working machine according to the first example.

FIG. 4 shows an equivalent circuit diagram in the state where the terminals of the reactor 101 are in a short-circuit state. In addition, the forward resistance of the diode 102b shown in FIG. 3 is assumed to be 0, and the reverse resistance of the diode 102a is assumed to be infinite. The discharge current of the charge accumulating capacitor 19 is denoted by i(t). The resistance value of the charging resistor 108 is denoted by Rr, and the capacitance of the smoothing capacitor 105 is denoted by Cd.

Figure 5:
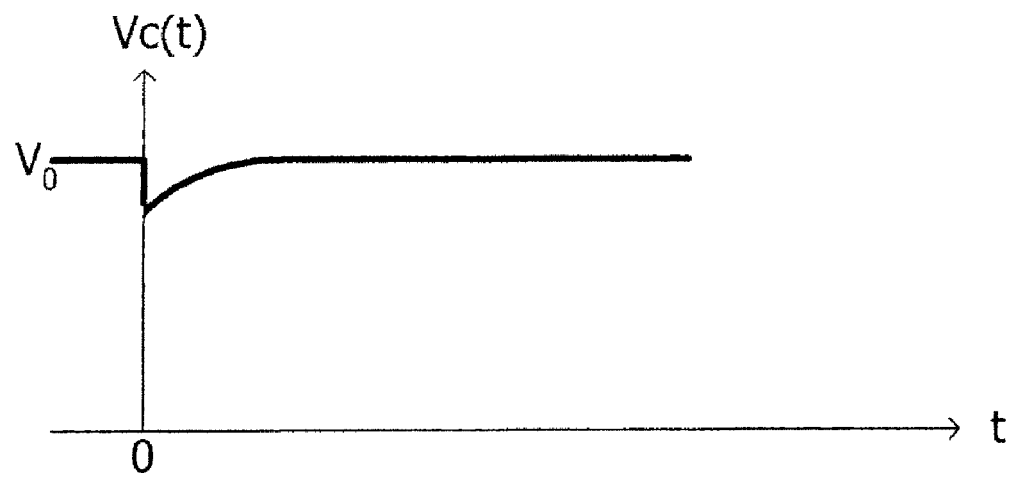
FIG. 5 is a graph showing an example of a variation in voltage and current for illustrating a method of measuring a characteristic of a capacitor of the hybrid type working machine according to the first example.
Figure 5:
Figure 5:
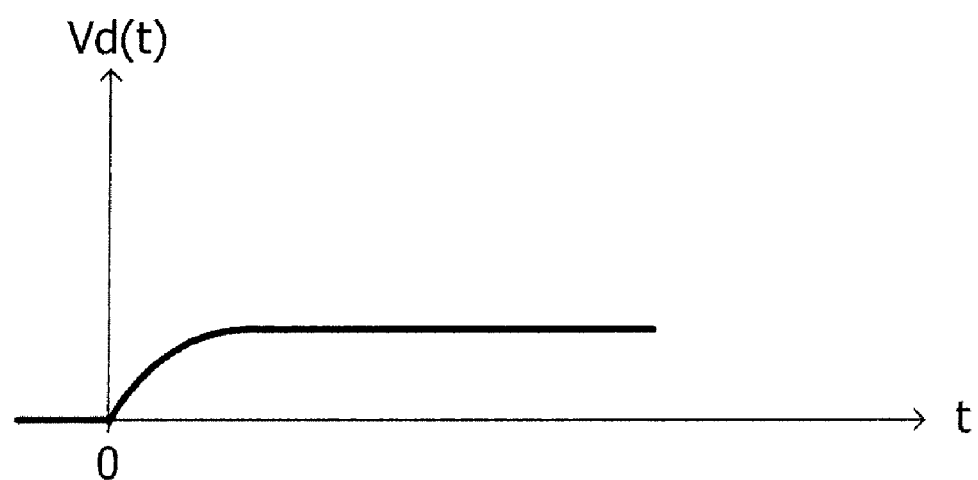

FIG. 5 shows a discharge characteristic after the timing t=0 of the charge accumulating capacitor 19 connected to the charging resistor 108 and the smoothing capacitor 105 shown in FIG. 4, and specifically shows changes in time of a current i(t), a voltage Vc(t) between terminals of the charge accumulating capacitor 19, and a voltage Vd(t) between terminals of the smoothing capacitor 105. When the start key 32 (FIG. 2) is turned on, the control device 30 closes the first switch 115 at the timing t=0. Before the first switch 115 is closed (the timing before starting the working machine, and specifically before turning on the start key 32), a voltage between terminals of the charge accumulating capacitor 19 is denoted by $V_0$. At the time when the first switch 115 is closed, the current i(t) rises up. At this time, since a voltage drop is generated by the internal resistance Rc, the voltage Vc(t) between the terminals of the charge accumulating capacitor 19 drops down.

The smoothing capacitor 105 is charged by the discharge current i(t), and the voltage Vd(t) between the terminals gradually increases. The discharge current i(t) gradually decreases in accordance with an increase in the voltage Vd(t) between the terminals. Since the voltage drop due to the internal resistance Rc becomes small in accordance with a decrease in the discharge current i(t), the voltage Vc(t) between the terminals of the charge accumulating capacitor 19 gradually increases. When the voltage Vc(t) between the terminals of the charge accumulating capacitor 19 becomes equal to the voltage Vd(t) between the terminals of the smoothing capacitor 105, the discharge current i(t) becomes 0.

When the discharge current i(t) becomes 0, the voltage Vc(t) between the terminals of the charge accumulating capacitor 19 is lower than the voltage $V_0$ between the terminals immediately before the timing t=0. However, since the capacitance Cc of the charge accumulating capacitor 19 is sufficiently large compared with the capacitance Cd of the smoothing capacitor 105, a decrease amount of the voltage Vc(t) between the terminals of the charge accumulating capacitor 19 is extremely small.

The current i(t) is expressed by the following expression.

[Expression 1]

$$i(t) = \frac{V_0}{R}\exp\left(-\frac{t}{CR}\right) \quad (1a)$$

$$R = Rc + Rr \quad (1b)$$

$$\frac{1}{C} = \frac{1}{Cc} + \frac{1}{Cd} \quad (1c)$$

In the expressions (1a) to (1c), the following expression is obtained when t=+0.

[Expression 2]

$$Rc = \frac{V_0}{i(+0)} - Rr \quad (2)$$

The current i(+0) has a magnitude of a current immediately after the first switch 115 is closed in response to the starting operation (in detail, a key ON) of the working machine, and may be measured by the capacitor ammeter 107. The voltage $V_0$ between the terminals of the charge accumulating capacitor 19 immediately before closing the first switch 115 may be measured by the capacitor voltmeter 106. The magnitude Rr of the charging resistor 108 is already known. Accordingly, it is possible to calculate the internal resistance Rc from the measurement values $V_0$ and i(+0), and the already known resistance value Rr.

In the case where a variation in the resistance value Rr of the charging resistor 108 is large due to a temperature variation, it is desirable to correct the resistance value of the charging resistor 108 on the basis of the temperature measured by the thermometer 112 shown in FIG. 3.

The following expression is obtained from the expression (1a).

[Expression 3]

$$C = \frac{\frac{t}{R}}{\ln\left(\frac{V_0}{R}\right) - \ln i(t)} \quad (3)$$

The current $i(T_1)$ at the time point of the timing $t=T_1$ is measured by the capacitor ammeter 107. The combined capacitance C is obtained by the following expression.

[Expression 4]

$$C = \frac{\frac{T_1}{R}}{\ln\left(\frac{V_0}{R}\right) - \ln i(T_1)} \quad (4)$$

The capacitance Cd of the smoothing capacitor 105 is already known.

Accordingly, it is possible to calculate the capacitance Cc of the charge accumulating capacitor 19 from the elapsed time $T_1$, the measurement values $V_0$ and $i(T_1)$, the calculation value of the internal resistance Rc, and the expressions (4), (1b), and (1c).

When the calculation of the internal resistance Rc and the capacitance Cc of the charge accumulating capacitor 19 is completed, the control device 30 opens the third switch 117 shown in FIG. 3. Accordingly, it is possible to perform the charge/discharge operation of the charge accumulating capacitor 19.

SECOND EXAMPLE

Next, a method of measuring a characteristic of the capacitor according to a second example will be described with reference to FIGS. 4 and 6.

Figure 6:
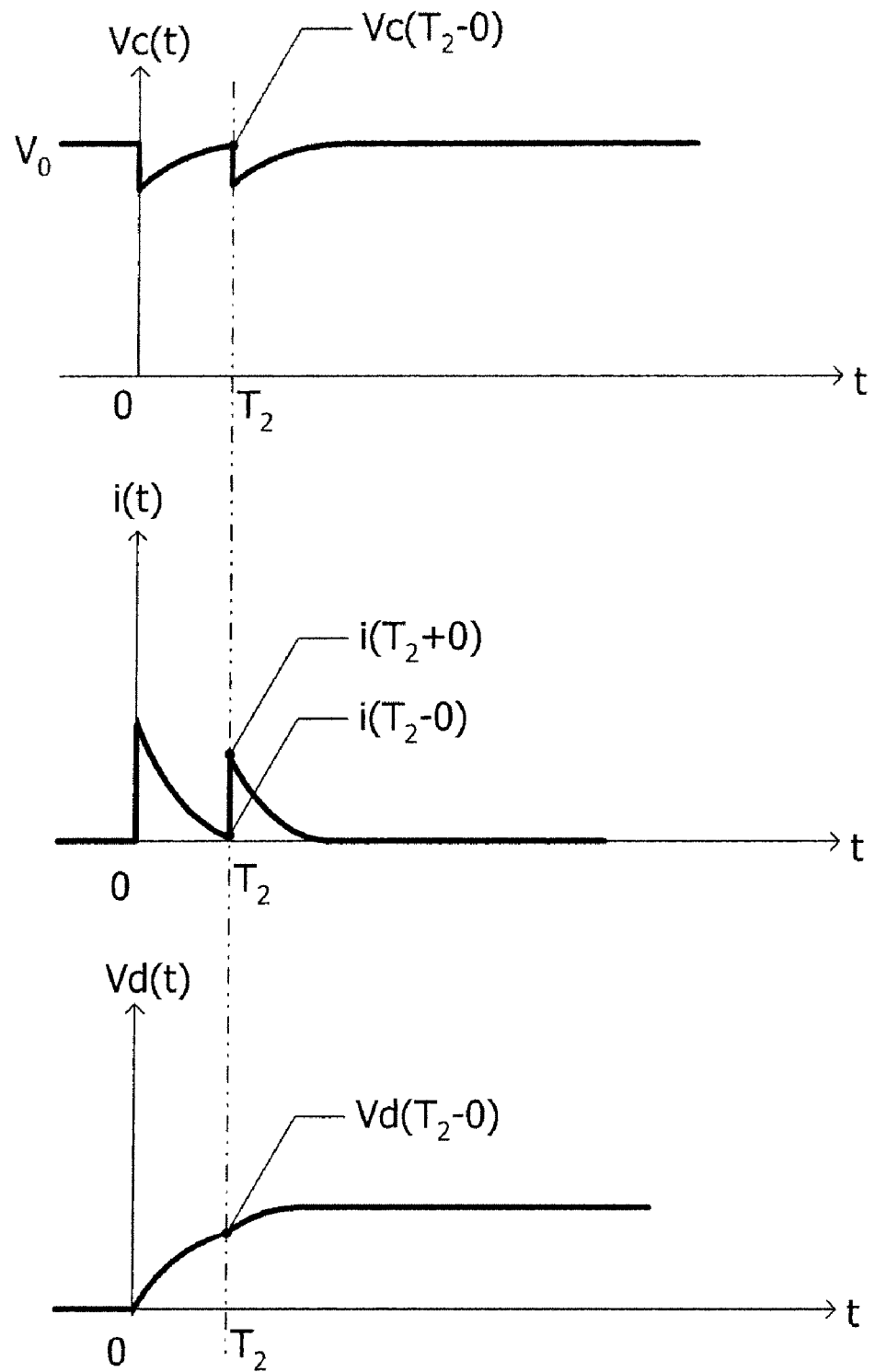
FIG. 6 is a graph showing an example of a variation in voltage and current for illustrating a method of measuring a characteristic of a capacitor of the hybrid type working machine according to a second example.

FIG. 6 shows a discharge characteristic after the timing t=0 of the charge accumulating capacitor 19 connected to the charging resistor 108, the second switch 116, and the smoothing capacitor 105.

At the timing t=0, the sequence of closing the first switch 115 is the same as that of the first example. In the second example, at the timing $t=T_2$ before the time point at which i=0, the second switch 116 is closed. When the second switch 116 is closed, since the DC resistance of the closed circuit where the discharge current i(t) flows decreases, the current i(t) rises up. When the current i(t) rises up, the voltage drop generated in the internal resistance Rc becomes large, and hence the voltage Vc(t) between the terminals of the charge accumulating capacitor 19 drops down.

The time constant of the closed circuit where the discharge current i(t) flows becomes short due to the short-circuit state of the charging resistor 108. For this reason, after the timing $t=T_2$, the current i(t) gradually decreases at a rate characterized by the shorter time constant. Since the voltage drop generated in the internal resistance Rc gradually decreases due to a decrease in the current i(t), the voltage Vc(t) between the terminals of the charge accumulating capacitor 19 gradually increases after the timing $t=T_2$. The voltage Vd(t) between the terminals of the smoothing capacitor 105 gradually increases at a rate characterized by the shorter time constant.

The voltage drop $Vr(T_2-0)$ immediately before the timing $t=T_2$ by the internal resistance Rc and the charging resistance Rr is expressed by the following expression.

[Expression 5]

$$Vr(T_2-0)=i(T_2-0)\times(Rc+Rr) \quad (5)$$

The voltage drop $Vr(T_2+0)$ due to the internal resistance Rc immediately after the timing $t=T_2$ is expressed by the following expression.

[Expression 6]

$$Vr(T_2+0)=i(T_2+0)\times Rc \quad (6)$$

Since the voltage across both ends of the capacitance Cc of the charge accumulating capacitor 19 and the voltage $Vd(t)$ between the terminals of the smoothing capacitor 105 do not discontinuously change, the expression of $Vr(T_2-0)=Vr(T_2+0)$ is satisfied. Accordingly, the following expression is satisfied.

[Expression 7]

$$i(T_2-0)\times(Rc+Rr)=i(T_2+0)\times Rc \quad (7)$$

In addition, the following expression is satisfied immediately before the timing $t=T_2$.

[Expression 8]

$$i(T_2-0)\times Rr=Vc(T_2-0)-Vd(T_2-0) \quad (8)$$

When the resistance value Rr of the charging resistor 108 is removed from the expressions (7) and (8), the following expression is obtained.

[Expression 9]

$$Rc = \frac{Vc(T_2-0)-Vd(T_2-0)}{i(T_2+0)-i(T_2-0)} \quad (9)$$

The right-hand member $Vc(T_2-0)$ of the expression (9) may be measured by the capacitor voltmeter 106, and the $Vd(T_2-0)$ may be measured by the DC bus line voltmeter 111. The current values $i(T_2+0)$ and $i(T_2-0)$ may be measured by the capacitor ammeter 107. Accordingly, it is possible to calculate the internal resistance Rc of the charge accumulating capacitor 19 as the left-hand member of the expression (9) from these measurement results. Since the expression (9) does not include the resistance value Rr of the charging resistor 108, it is possible to obtain the internal resistance Rc without the influence of a variation in the resistance value Rr of the charging resistor 108.

The time constant of a decrease in the current $i(t)$ after the timing $t=T_2$ is $C\times Rc$. Since the internal resistance Rc is calculated on the basis of the expression (9), when the time constant of a decrease in the current $i(t)$ is known, it is possible to calculate the capacitance Cc of the charge accumulating capacitor 19.

It is possible to obtain the time constant of a decrease in the current $i(t)$ from a variation in the current $i(t)$ after the timing $t=T_2$ of FIG. 6. As an example, it is possible to obtain the time constant from a value of the current $i(t)$ of at least two points after the timing $t=T_2$.

When the calculation of the internal resistance Rc and the capacitance Cc of the charge accumulating capacitor 19 is completed, the control device 30 opens the second switch 116 and the third switch 117 shown in FIG. 3. Accordingly, it is possible to perform the charge/discharge operation of the charge accumulating capacitor 19.

THIRD EXAMPLE

Next, a method of measuring a characteristic of the capacitor according to a third example will be described with reference to FIGS. 7 and 8.

Figure 7:
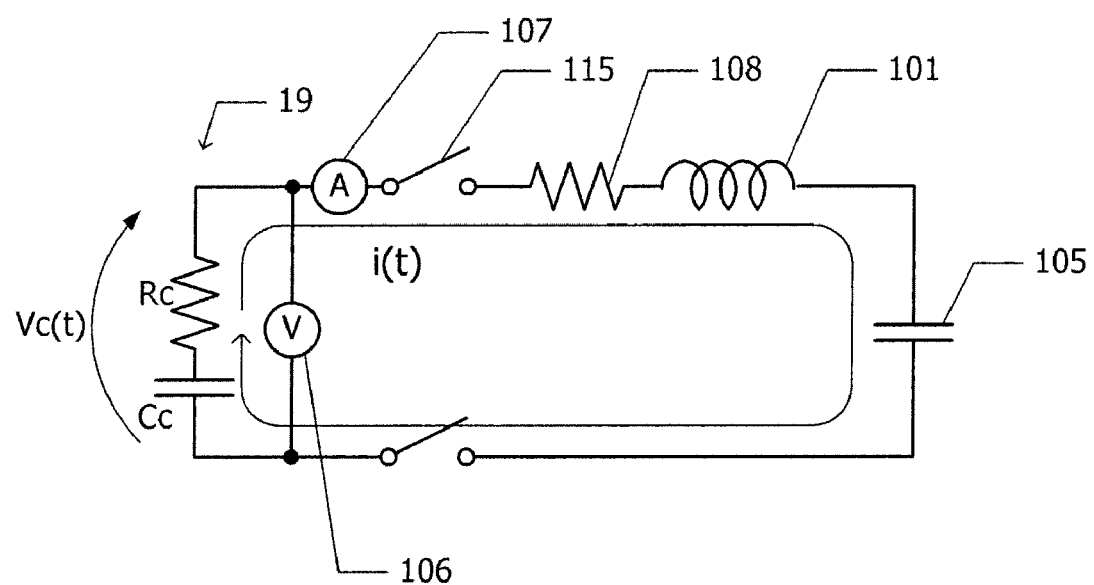
FIG. 7 is an equivalent circuit diagram for illustrating a method of measuring a characteristic of a capacitor of the hybrid type working machine according to a third example.

FIG. 7 shows an equivalent circuit diagram applied to the third example. Upon starting the hybrid type working machine, a charge is accumulated in the charge accumulating capacitor 19, and a charge is hardly accumulated in the smoothing capacitor 105. When the hybrid type working machine is started, the control device 30 (FIGS. 2 and 3) closes the first switch 115. Hereinafter, in FIG. 7, it is supposed that the first switch 115 is turned on at the timing $t=0$.

Figure 8:
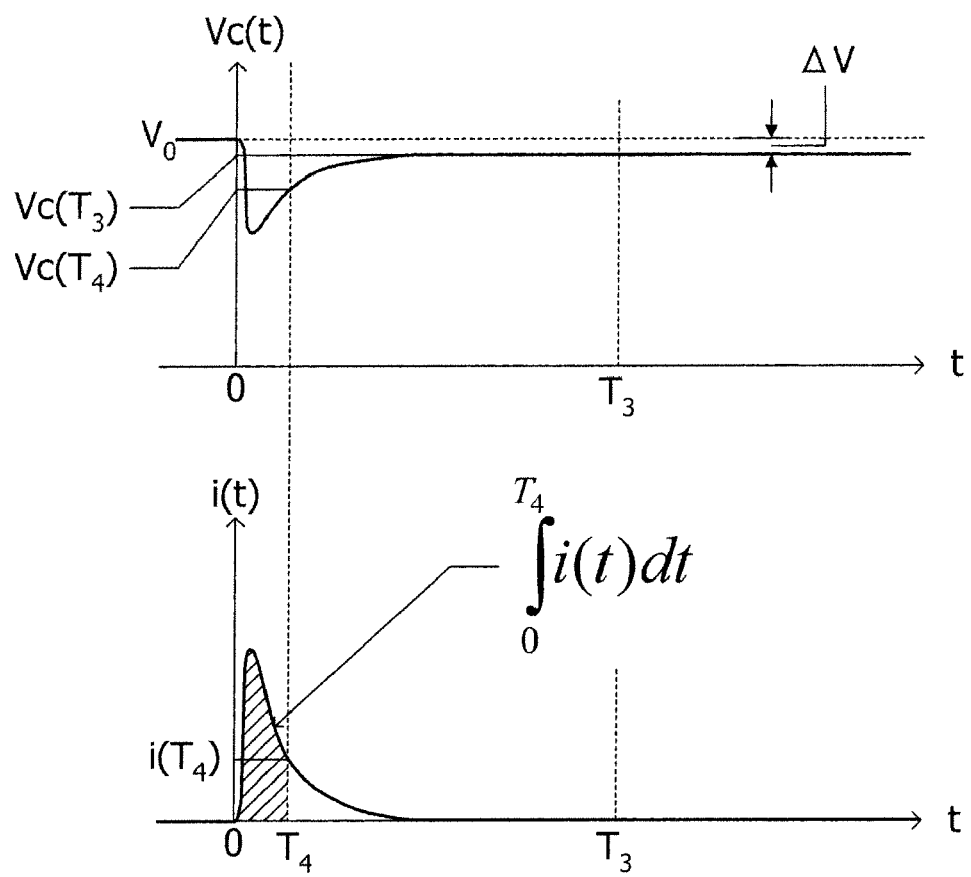
FIG. 8 is a graph showing an example of a variation in voltage and current for illustrating a method of measuring a characteristic of a capacitor of the hybrid type working machine according to the third example.

FIG. 8 shows a discharge characteristic of the charge accumulating capacitor 19 connected to the charging resistor 108, the reactor 101, and the smoothing capacitor 105 shown in FIG. 7 after the timing $t=0$. When the first switch 115 becomes an ON state at the timing $t=0$ by turning on the start key 32 (FIG. 2), the discharge current $i(t)$ of the charge accumulating capacitor 19 starts to flow. However, the timing indicating the maximum value of the discharge current $i(t)$ is slightly later than the timing $t=0$ due to the influence of the reactor 101. After the discharge current $i(t)$ becomes maximal, the discharge current $i(t)$ gradually decreases, and becomes 0 at the time point when the voltage between the terminals of the charge accumulating capacitor 19 is equal to the voltage between the terminals of the smoothing capacitor 105. In general, when the combined resistance, the inductance, and the combined capacitance of the LCR circuit shown in FIG. 7 are respectively denoted by R, L, and C, the expression of $R^2>(4\,L/C)$ is satisfied. For this reason, overdamping occurs instead of vibration damping.

Before the first switch 115 becomes an ON state, the voltage $Vc(t)$ measured by the capacitor voltmeter 106 is denoted by $V_0$. When the discharge current $i(t)$ flows by turning on the first switch 115, the voltage $Vc(t)$ between the terminals decreases due to the voltage drop caused by the internal resistance Rc of the charge accumulating capacitor 19. As the discharge current $i(t)$ decreases, the voltage $Vc(t)$ increases. However, since a part of the charge has moved from the charge accumulating capacitor 19 to the smoothing capacitor 105 before the discharge current $i(t)$ is 0, the voltage $Vc(t)$ is not recovered to the initial value $V_0$. In detail, the expression of $\Delta V=V_0-Vc(\infty)=V_0\times Cd/(Cc+Cd)$ is satisfied. Here, Cd denotes the capacitance of the smoothing capacitor 105.

The voltage $Vc(t)$ measured by the voltmeter 106 shown in FIG. 7 is expressed by the following expression.

[Expression 10]

$$Vc(t) = V_0 - \frac{1}{Cc}\int_0^t i(t)\,dt - Rc \cdot i(t) \quad (10)$$

When $t=T_3$ by modifying the expression (10), the following expression is obtained.

[Expression 11]

$$Cc = \frac{1}{V_0 - Vc(T_3) - Rc \cdot i(T_3)}\int_0^{T_3} i(t)\,dt \quad (11)$$

When the period from the timing t=0 to the timing $T_3$ is set to be sufficiently long until the discharge current i(t) is almost equal to 0 as shown in FIG. 8, Rc·i($T_3$) of the expression (11) may be approximate to 0. When the elapsed time t is set to be large, $V_0$−Vc(t) is approximate to the finite value ΔV, and does not become 0. In the case where Rc·i($T_3$) is sufficiently small compared with $V_0$−Vc($T_3$), the expression (11) is approximate as below.

[Expression 12]

$$Cc \approx \frac{1}{V_0 - Vc(T_3)} \int_0^{T_3} i(t) \, dt \quad (12)$$

It is possible to measure the voltage Vc($T_3$) at the timing t=$T_3$. It is possible to calculate the right-hand integral term by measuring the discharge current i(t) from the timing t=0 to the timing t=$T_3$ at the short time interval capable of tracing a variation in current. Accordingly, it is possible to calculate the capacitance Cc of the charge accumulating capacitor 19 from the expression (12).

As an example, when Rc·i($T_3$) is equal to or less than 1/10 of $V_0$−Vc($T_3$) in the expression (11), the approximation of the expression (12) is satisfied at sufficient precision. Since the voltage decrease amount ΔV shown in FIG. 8 is smaller than $V_0$−Vc($T_3$), it is supposed that the approximation of the expression (12) may be applied when Rc·i($T_3$) is equal to or less than 1/10 of ΔV.

The voltage decrease amount ΔV at the timing t=∞ is $V_0$×Cd/(Cc+Cd). That is, the time when Rc·i($T_3$) is equal to or less than 1/10 of ΔV=$V_0$×Cd/(Cc+Cd) may be adopted as the time $T_3$. At this time, as the capacitance Cc and the internal resistance Rc of the charge accumulating capacitor 19, the precise value at the current time point may not be used, but the initial value or the rated value of the capacitance Cc and the internal resistance Rc of the charge accumulating capacitor 19 may be used.

In addition, in the state where the charge accumulating capacitor 19 is not degraded, the discharge current i(t) shown in FIG. 8 may be measured, and the timing $T_3$ at which Rc·i(t) is equal to or less than 1/10 of ΔV=$V_0$×Cd/(Cc+Cd) may be determined in advance. As the timing $T_3$ used in measuring the characteristic of the capacitor at the time of startup of the hybrid type working machine, the timing $T_3$ which is determined in advance in the state where the charge accumulating capacitor is not degraded may be adopted.

When t=$T_4$ by modifying the expression (11), the following expression is obtained.

[Expression 13]

$$Rc = \frac{V_0 - Vc(T_4) - \frac{1}{Cc} \int_o^{T_4} i(t) \, dt}{i(T_4)} \quad (13)$$

It is possible to measure the voltage Vc($T_4$) and the current i($T_4$) of the expression (13). It is possible to calculate the right-hand integral term by measuring the discharge current i(t) from the timing t=0 to the timing t=$T_4$ at the short time interval capable of tracing a variation in current. The capacitance Cc is calculated by using the expression (12). Accordingly, it is possible to calculate the internal resistance Rc from the expression (13).

When the denominator i($T_4$) of the expression (13) is 0, the calculation error occurs. Accordingly, as shown in FIG. 8, it is necessary to select the timing $T_4$ in a period during which the discharge current i($T_4$) is not 0. In detail, it is necessary to select the timing $T_4$ to be earlier than the timing $T_3$. In addition, when the timing $T_4$ is selected so as to be earlier than the timing at which the discharge current i(t) has the maximum value, the measurement error of the integral term of the expression (13) becomes large. For this reason, it is desirable to select the timing $T_4$ to be later than the timing at which the discharge current i(t) has the maximum value.

When the current i($T_4$) is substantially equal to 0, the measurement error of the current i($T_4$) has a large influence on the calculation result of the internal resistance Rc. For this reason, it is desirable to select the timing $T_4$ under the condition that the current i($T_4$) is sufficiently large. As an example, it is desirable to select the timing $T_4$ under the condition that the current i($T_4$) is equal to or larger than 1/3 of the maximum value of the discharge current i(t).

Figure 9:
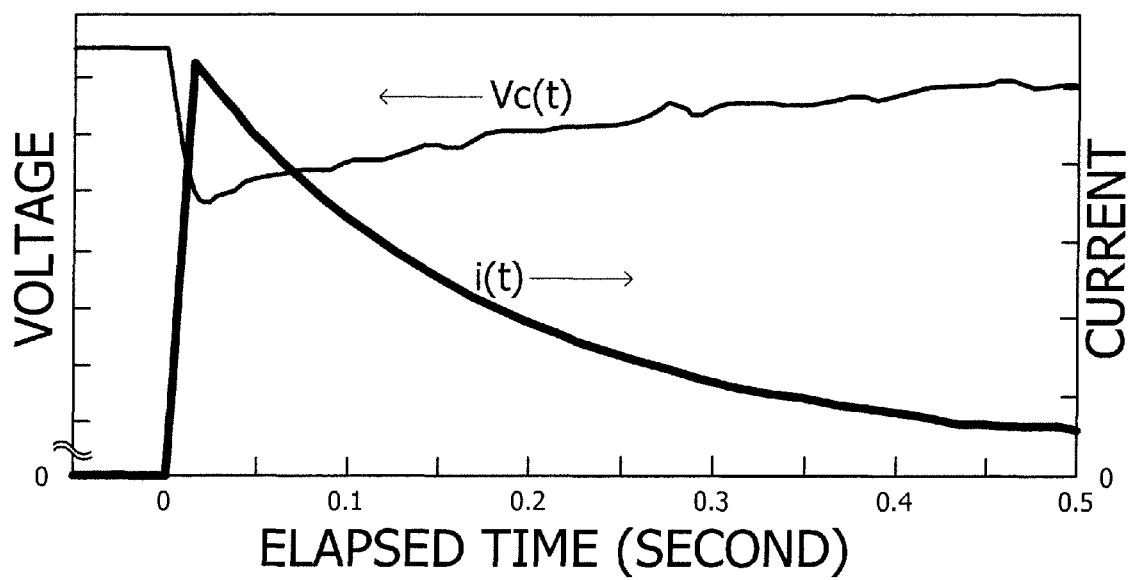
FIG. 9 is a graph showing an actual measurement value of a variation in voltage and current of a capacitor of the hybrid type working machine according to the third example.

FIG. 9 shows an example of the actual measurement result of the voltage Vc(t) between the terminals of the charge accumulating capacitor 19 and the discharge current i(t). The horizontal axis indicates the elapsed time having the unit of "second" from the ON state of the first switch 115. The left vertical axis indicates the voltage Vc(t) between the terminals at an arbitrary unit. The right vertical axis indicates the discharge current at an arbitrary unit.

At the timing 0, the discharge current i(t) abruptly rises up. By integrating the discharge current i(t), it is possible to calculate the integral terms of the expressions (12) and (13).

In the third example, as shown in the expressions (12) and (13), it is not necessary to use the capacitance of the smoothing capacitor 105 and the resistance value of the charging resistor 108 for the calculation of the capacitive characteristic of the charge accumulating capacitor 19. For this reason, it is possible to measure the characteristic of the charge accumulating capacitor 19 without the influence of the elements. In addition, it is not necessary to short-circuit the both ends of the reactor 101.

FOURTH EXAMPLE

Next, a fourth example will be described. In the fourth example, the internal resistance Rc is calculated by approximating the third term in the numerator of the right-hand side of the expression (13) to 0. That is, the internal resistance Rc is calculated by the following expression.

[Expression 14]

$$Rc = \frac{V_0 - Vc(T_4)}{i(T_4)} \quad (14)$$

The third term in the numerator of the right-hand side of the expression (13) is a decrease amount of the voltage corresponding to the charge amount vanished by the discharge of the charge accumulating capacitor 19 until the timing $T_4$. The decrease amount of the voltage is smaller than the decrease amount of the voltage ΔV=$V_0$×Cd/(Cc+Cd) when the elapsed time t is ∞. Accordingly, when the timing $T_4$ is selected so that $V_0$−Vc($T_4$) is sufficiently larger than ΔV, the expression (14) is obtained with high precision. As an example, when the timing $T_4$ is selected so that $V_0$−Vc($T_4$) is equal to or larger than five times the decrease amount ΔV, it is possible to ensure sufficient precision.

In the fourth example, it is possible to calculate the internal resistance Rc without measuring the capacitance Cc of the charge accumulating capacitor 19. In addition, the value of the discharge current may be measured only at the timing $T_4$. It is not necessary to measure the time history of the discharge current i(t).

FIFTH EXAMPLE

Next, a fifth example will be described with reference to FIGS. 7 and 10. Even in the fifth example, the equivalent circuit which is shown in FIG. 7 and is the same as that of the third example is applied. In the above-described expression (10), when $t=T_5$, the following expression is obtained.

[Expression 15]

$$Vc(T_5) = V_0 - \frac{1}{Cc}\int_0^{T_5} i(t)dt - Rc \cdot i(T_5) \qquad (15)$$

In the same manner, when $t=T_6$, the following expression is obtained.

[Expression 16]

$$Vc(T_6) = V_0 - \frac{1}{Cc}\int_0^{T_6} i(t)dt - Rc \cdot i(T_6) \qquad (16)$$

The following expression is obtained from the expressions (15) and (16).

[Expression 17]

$$Vc(T_5) - Vc(T_6) = \frac{1}{Cc}\int_{T_5}^{T_6} i(t)dt - Rc\{i(T_5) - i(T_6)\} \qquad (17)$$

Since the voltage $Vc(T_7)$ may be obtained even at the timing $t=T_7$ as in the expressions (15) and (16), the following expression is obtained.

[Expression 18]

$$Vc(T_6) - Vc(T_7) = \frac{1}{Cc}\int_{T_6}^{T_7} i(t)dt - Rc\{i(T_6) - i(T_7)\} \qquad (18)$$

Figure 10:
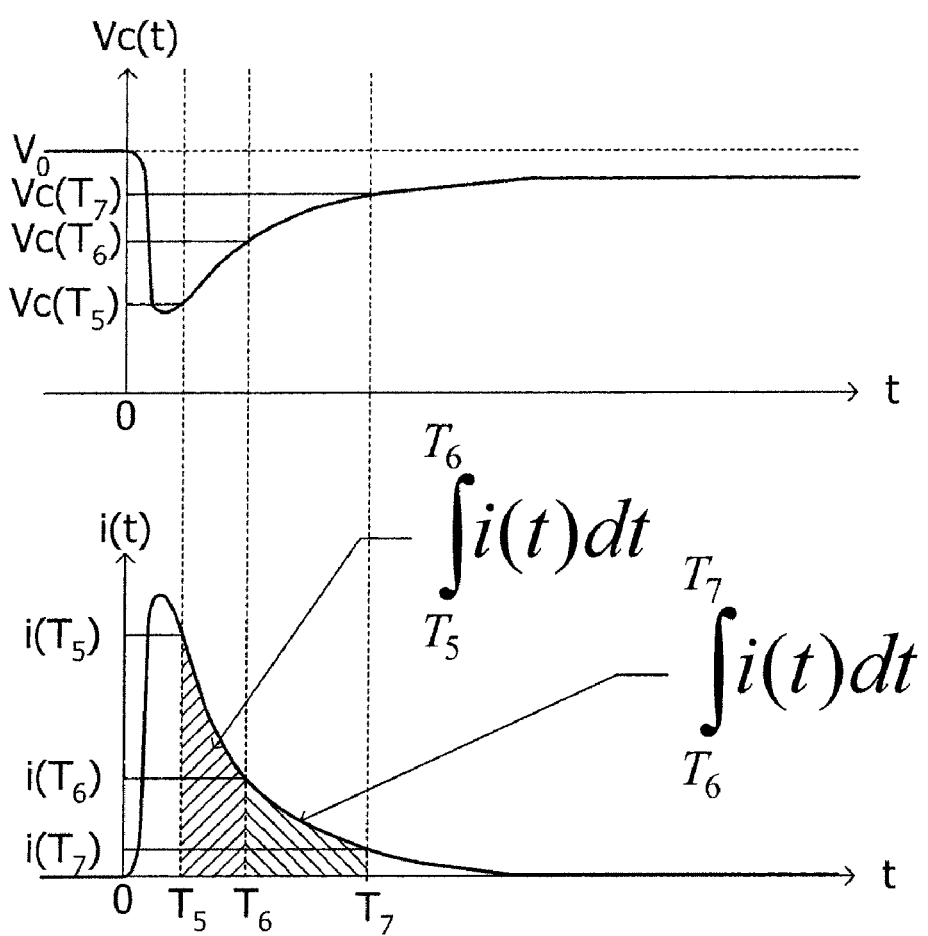
FIG. 10 is a graph showing an example of a variation in voltage and current for illustrating a method of measuring a characteristic of a capacitor of the hybrid type working machine according to a fifth example of the invention.

In the expressions (17) and (18), the terms other than the capacitance Cc and the internal resistance Rc are physical amounts which can be measured as shown in FIG. 10. Accordingly, it is possible to calculate the capacitance Cc and the internal resistance Rc by solving the simultaneous equations with two unknowns of the expressions (17) and (18).

In the fifth example, at the timings $T_5$, $T_6$, and $T_7$ ($T_5<T_6<T_7$) after making the first switch 1150N state, the capacitance Cc and the internal resistance Rc are obtained by measuring the voltage Vc(t) between the terminals of the charge accumulating capacitor 19, the discharge current i(t), the integral value of the discharge current from the timing $T_5$ to the timing $T_6$, and the integral value of the discharge current from the timing $T_6$ to the timing $T_7$. Since it is not necessary to use the measurement values of the current and the voltage abruptly changing in the vicinity of the timing $t=0$, it is possible to increase the interval width of the timing of measuring the voltage and the current. In addition, the integral value of the discharge current i(t) may be calculated in two periods among the period from the timing $T_5$ to the timing $T_6$, the period from the timing $T_5$ to the timing $T_7$, and the period from the timing $T_6$ to the timing $T_7$.

In the first to fifth examples, as the hybrid type working machine, the shovel for performing the regenerating operation of the turning electric motor 21 has been described. The method of measuring the characteristic of the charge accumulating capacitor 19 described in the examples may be applied to the crane having a winding driving device. In this case, potential energy of the winding target is converted into electric energy. The generated electric energy is accumulated in the charge accumulating capacitor 19. During the winding operation, the winding motor is driven by the discharge current obtained from the charge accumulating capacitor 19 and the electric power generated from the electric motor generator 12.

In addition, the control method of the charge accumulating circuit 90 according to the above-described examples may be applied to a lifting magnet type working machine. In this case, the suction operation of the lifting magnet is performed by the discharge current from the charge accumulating capacitor 19.

Since the electric motor generator 12 is rotated during the operation of the working machine, the voltage of the DC bus line changes due to the influence of the induced voltage, change in voltage being detected as noise. In the first to fifth examples, the internal resistance or the capacitance is measured by the charge accumulating capacitor 19 upon starting the working machine. For this reason, it is possible to improve the measurement precision.

In addition, in the hybrid type working machine, since the lifting operation, the excavating operation, or the like is performed during the operation, the charge/discharge operation of the charge accumulating capacitor 19 is frequently performed. For this reason, if it is not possible to accurately understand a variation in the characteristic such as the internal resistance of the charge accumulating capacitor 19, it is not possible to accurately calculate the charge rate. When the calculated charge rate is not accurate, there is concern in that sufficient power may not be supplied to the electric motor. As a result, in some cases, it is not possible to operate the working machine. In the first to fifth examples, it is possible to improve the calculation precision of the capacitance and the internal resistance of the charge accumulating capacitor 19. Accordingly, it is possible to realize the stable operation of the working machine.

While the exemplary examples of the invention have been described, the invention is not limited thereto. For example, it is obvious that various modifications, corrections, combinations, and the like may be made by the person skilled in the art.

What is claimed is:
1. A hybrid type working machine comprising:
   a first electric motor which performs a power running operation driven by a supply of electric power and a regenerating operation generating electric power;
   a first electric circuit which controls the power running operation and the regenerating operation of the first electric motor;
   a charge accumulating circuit which supplies electric power to the first electric motor and accumulates electric power regenerated by the first electric motor;
   a control device which controls the first electric circuit and the charge accumulating circuit; and
   a start key which activates the control device, wherein the charge accumulating circuit includes:
a DC bus line which is connected to the first electric circuit and in which a smoothing capacitor is connected between a ground line and a power line;
a charge accumulating capacitor with an internal resistance;
a converter which connects the DC bus line and the charge accumulating capacitor to each other, and performs a discharge operation of supplying electric energy from the charge accumulating capacitor to the DC bus line and a charge operation of supplying electric energy from the DC bus line to the charge accumulating capacitor; and
a first switch which performs switching between an ON state and an OFF state, the ON state allowing current to flow between the charge accumulating capacitor and the DC bus line, and the OFF state not allowing current to flow between the charge accumulating capacitor and the DC bus line, and
wherein the control device switches the first switch from the OFF state to the ON state due to the start key being turned on, measures a physical quantity involved with a discharge characteristic of the charge accumulating capacitor, and calculates at least one of the internal resistance and a capacitance of the charge accumulating capacitor on the basis of a measurement result.

2. The hybrid type working machine according to claim 1, wherein the control device obtains a first measurement value by measuring a voltage between terminals of the charge accumulating capacitor when the first switch is in the OFF state, obtains a second measurement value by measuring a discharge current of the charge accumulating capacitor when the first switch is in the ON state, and calculates the internal resistance of the charge accumulating capacitor on the basis of the first measurement value and the second measurement value.

3. The hybrid type working machine according to claim 2, wherein the control device obtains a third measurement value by measuring the discharge current of the charge accumulating capacitor at a time point elapsed by a first elapsed time from a time point when the first switch becomes the ON state, and calculates the capacitance of the charge accumulating capacitor on the basis of the first measurement value, the calculation value of the internal resistance, the third measurement value, and the first elapsed time.

4. The hybrid type working machine according to claim 2, wherein the charge accumulating circuit includes a charging resistor which is connected in series to the charge accumulating capacitor, and
wherein the control device calculates the internal resistance of the charge accumulating capacitor on the basis of a resistance value of the charging resistor.

5. The hybrid type working machine according to claim 4, further comprising;
a thermometer which measures a temperature of the charging resistor,
wherein the control device corrects the resistance value of the charging resistor on the basis of the temperature of the charging resistor upon calculating the internal resistance of the charge accumulating capacitor.

6. The hybrid type working machine according to claim 1, further comprising:
a charging resistor which is connected in series to the charge accumulating capacitor; and a second switch which is connected in parallel to the charging resistor and is configured to short-circuit the charging resistor,
wherein the control device turns on the second switch to short-circuit the charging resistor at a second timing after the first switch becomes the ON state, and calculates the internal resistance of the charge accumulating capacitor on the basis of a voltage between terminals of the smoothing capacitor and the charge accumulating capacitor immediately before the second timing and a discharge current of the charge accumulating capacitor immediately before and after the second timing.

7. The hybrid type working machine according to claim 6, wherein the control device calculates the capacitance of the charge accumulating capacitor on the basis of a calculation value of the internal resistance of the charge accumulating capacitor and a time constant of a decrease in the discharge current from the charge accumulating capacitor after turning on the second switch.

8. The hybrid type working machine according to claim 1, wherein the control device obtains a first measurement value by measuring a voltage between terminals of the charge accumulating capacitor when the first switch is in the OFF state, obtains a first integral value as an integral value of a discharge current of the charge accumulating capacitor until a third timing elapsed by a third elapsed time from a time point at which the first switch becomes the ON state, obtains a third measurement value by measuring a voltage between the terminals of the charge accumulating capacitor at the third timing, and calculates a capacitance of the charge accumulating capacitor on the basis of the first measurement value, the first integral value, and the third measurement value.

9. The hybrid type working machine according to claim 8, wherein assuming that a capacitance of the smoothing capacitor is denoted by $Cd$, a rated value of the capacitance of the charge accumulating capacitor is denoted by $Cc$, a rated value of the internal resistance is denoted by $Rc$, a discharge current at the third timing is denoted by $i(T_3)$, and the first measurement value is denoted by $V_0$, the third timing is selected so that $Rc \times i(T_3)$ is equal to or less than $1/10$ of $V_0 \times (Cd/(Cc+Cd))$.

10. The hybrid type working machine according to claim 8, wherein the control device further obtains a fourth measurement value and a fifth measurement value by respectively measuring a voltage between terminals of the charge accumulating capacitor and a discharge current of the charge accumulating capacitor at a fourth timing before the third timing and after the first switch becomes the ON state, obtains a second integral value by calculating an integral value of a discharge current of the charge accumulating capacitor until the fourth timing from a time point at which the first switch becomes the ON state, and calculates the internal resistance of the charge accumulating capacitor on the basis of the first measurement value, the fourth measurement value, the fifth measurement value, the second integral value, and the calculated capacitance of the charge accumulating capacitor.

11. The hybrid type working machine according to claim 1, wherein the control device obtains a first measurement value by measuring a voltage between terminals of the charge accumulating capacitor when the first switch is in the OFF state, obtains a fourth measurement value and a fifth measurement value by respectively measuring a voltage between the terminals of the charge accumulating capacitor and a discharge current of the charge accumulating capacitor at a fourth timing after the first switch becomes the ON state, and calculates the internal resistance of the charge accumulating capacitor on the basis of the first measurement value, the fourth measurement value, and the fifth measurement value.

12. The hybrid type working machine according to claim 1, wherein the control device measures a discharge current and a voltage between terminals of the charge accumulating capacitor at a fifth timing, a sixth timing, and a seventh timing elapsed by a fifth elapsed time, a sixth elapsed time, and a seventh elapsed time from a time point at which the first switch is changed from the OFF state to the ON state, calculates integral values of the discharge current at two periods among a period from the fifth timing to the sixth timing, a period from the fifth timing to the seventh timing, and a period from the sixth timing to the seventh timing, and calculates the internal resistance and a capacitance of the charge accumulating capacitor on the basis of the calculated integral values, the measured discharge current, and the measured voltage between the terminals.

* * * * *